(12) United States Patent
Kemper et al.

(10) Patent No.: US 7,705,962 B2
(45) Date of Patent: Apr. 27, 2010

(54) LITHOGRAPHIC APPARATUS AND DEVICE MANUFACTURING METHOD

(75) Inventors: Nicolaas Rudolf Kemper, Eindhoven (NL); Sjoerd Nicolaas Lambertus Donders, Vught (NL); Christiaan Alexander Hoogendam, Veldhoven (NL); Nicolaas Ten Kate, Almkerk (NL); Frits Van Der Meulen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 923 days.

(21) Appl. No.: 11/330,394

(22) Filed: Jan. 12, 2006

(65) Prior Publication Data

US 2006/0158627 A1 Jul. 20, 2006

Related U.S. Application Data

(60) Provisional application No. 60/643,626, filed on Jan. 14, 2005.

(51) Int. Cl.
*G03B 27/52* (2006.01)
*G03B 27/42* (2006.01)
*G03B 27/32* (2006.01)

(52) U.S. Cl. .............................. 355/30; 355/53; 355/77

(58) Field of Classification Search ................... 355/30, 355/53, 72, 77
See application file for complete search history.

(56) References Cited

U.S. PATENT DOCUMENTS

| 3,573,975 A | 4/1971 | Dhaka et al. ................. 117/212 |
| 3,648,587 A | 3/1972 | Stevens ......................... 95/44 |
| 4,346,164 A | 8/1982 | Tabarelli et al. ............. 430/311 |
| 4,390,273 A | 6/1983 | Loebach et al. .............. 355/125 |
| 4,396,705 A | 8/1983 | Akeyama et al. ............. 430/326 |
| 4,480,910 A | 11/1984 | Takanashi et al. .............. 355/30 |
| 4,509,852 A | 4/1985 | Tabarelli et al. |
| 5,040,020 A | 8/1991 | Rauschenbach et al. ........ 355/53 |
| 5,121,256 A | 6/1992 | Corle et al. .................. 359/664 |
| 5,610,683 A | 3/1997 | Takahashi ..................... 355/53 |
| 5,825,043 A | 10/1998 | Suwa .......................... 250/548 |
| 5,900,354 A | 5/1999 | Batchelder .................. 430/395 |
| 6,191,429 B1 | 2/2001 | Suwa .......................... 250/548 |
| 6,236,634 B1 | 5/2001 | Lee et al. ..................... 369/112 |
| 6,600,547 B2 | 7/2003 | Watson et al. ................. 355/30 |
| 6,603,130 B1 | 8/2003 | Bisschops et al. ......... 250/492.1 |

(Continued)

FOREIGN PATENT DOCUMENTS

DE 206 607 2/1984

(Continued)

OTHER PUBLICATIONS

English Translation of WO 2004/053955 A1 (dated Jun. 24, 2004).*

(Continued)

*Primary Examiner*—Alan A Mathews
(74) *Attorney, Agent, or Firm*—Pillsbury Winthrop Shaw Pittman, LLP

(57) ABSTRACT

A liquid confinement structure configured to contain a liquid in a space between a projection system and a substrate has a recess in its lower surface which is open to both a relatively low pressure source and a relatively high pressure source and through which liquid and/or gas from between the liquid confinement structure and the substrate is extracted.

23 Claims, 3 Drawing Sheets

U.S. PATENT DOCUMENTS

| | | | |
|---|---|---|---|
| 6,952,253 | B2 | 10/2005 | Lof et al. |
| 7,012,673 | B2 | 3/2006 | Kolesnychenko et al. ...... 355/53 |
| 2002/0020821 | A1 | 2/2002 | Van Santen et al. ......... 250/492 |
| 2002/0163629 | A1 | 11/2002 | Switkes et al. ................ 355/53 |
| 2003/0123040 | A1 | 7/2003 | Almogy ....................... 355/69 |
| 2004/0000627 | A1 | 1/2004 | Schuster ................. 250/201.2 |
| 2004/0075895 | A1 | 4/2004 | Lin ............................ 359/380 |
| 2004/0114117 | A1 | 6/2004 | Bleeker ....................... 355/53 |
| 2004/0136494 | A1 | 7/2004 | Lof et al. |
| 2004/0160582 | A1 | 8/2004 | Lof et al. ...................... 355/30 |
| 2004/0165159 | A1 | 8/2004 | Lof et al. ...................... 355/30 |
| 2004/0207824 | A1 | 10/2004 | Lof et al. ...................... 355/30 |
| 2004/0211920 | A1 | 10/2004 | Derksen et al. .......... 250/492.1 |
| 2004/0239954 | A1 | 12/2004 | Bischoff ..................... 356/635 |
| 2004/0257544 | A1 | 12/2004 | Vogel et al. .................. 355/30 |
| 2004/0263809 | A1 | 12/2004 | Nakano ....................... 355/30 |
| 2005/0007569 | A1 | 1/2005 | Streefkerk et al. ............ 355/30 |
| 2005/0018155 | A1 | 1/2005 | Cox et al. .................... 355/30 |
| 2005/0024609 | A1 | 2/2005 | De Smit et al. ............... 355/18 |
| 2005/0030497 | A1 | 2/2005 | Nakamura ................... 355/30 |
| 2005/0046813 | A1 | 3/2005 | Streefkerk et al. ............ 355/30 |
| 2005/0046934 | A1 | 3/2005 | Ho et al. ..................... 359/380 |
| 2005/0052632 | A1 | 3/2005 | Miyajima .................... 355/53 |
| 2005/0094116 | A1 | 5/2005 | Flagello et al. ............... 355/53 |
| 2005/0094125 | A1 | 5/2005 | Arai ............................ 355/72 |
| 2005/0122505 | A1 | 6/2005 | Miyajima .................... 355/72 |
| 2005/0132914 | A1 | 6/2005 | Mulkens et al. .......... 101/463.1 |
| 2005/0134817 | A1 | 6/2005 | Nakamura ................... 355/53 |
| 2005/0140948 | A1 | 6/2005 | Tokita ......................... 355/30 |
| 2005/0146693 | A1 | 7/2005 | Ohsaki ........................ 355/30 |
| 2005/0146694 | A1 | 7/2005 | Tokita ......................... 355/30 |
| 2005/0151942 | A1 | 7/2005 | Kawashima ................. 355/30 |
| 2005/0200815 | A1 | 9/2005 | Akamatsu ................... 353/53 |
| 2005/0213065 | A1 | 9/2005 | Kitaoka ....................... 355/53 |
| 2005/0213066 | A1 | 9/2005 | Sumiyoshi ................... 355/53 |
| 2005/0219489 | A1 | 10/2005 | Nei et al. ..................... 355/53 |
| 2005/0233081 | A1 | 10/2005 | Tokita ....................... 427/256 |
| 2006/0038968 | A1* | 2/2006 | Kemper et al. ............... 355/18 |
| 2006/0126037 | A1 | 6/2006 | Jansen et al. ................. 355/30 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 489 462 A2 | 12/2004 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2005-183744 A | 7/2005 |
| JP | 2006-060016 A | 3/2006 |
| JP | 2006-080542 A | 3/2006 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/195135 | 11/2004 |
| WO | WO 2005/003864 A2 | 1/2005 |
| WO | WO 2005/010611 | 2/2005 |
| WO | WO 2005/024517 | 3/2005 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003

H. Kawata et al., "Optical Projection Lithography using Lenses with Numberical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).

European Search Report issued for European Patent Application No. 06250137.4-2222, dated Mar. 20, 2007.

Australian Search Report issued for Singapore Patent Application No. 200600186-1, dated Nov. 27, 2006.

English Translation of Japanese Official Action issued on Oct. 9, 2008 in Japanese Application No. 2006-005636.

Translation of Notice of Reasons for Rejection for Japanese Patent Application No. 2006-005636 dated Aug. 17, 2009.

* cited by examiner

LITHOGRAPHIC APPARATUS AND DEVICE MANUFACTURING METHOD

1. RELATED APPLICATIONS

This application claims priority to and benefit of U.S. Provisional Application No. 60/643,626, filed Jan. 14, 2005, the entire contents of which is hereby incorporated by reference.

2. FIELD

The present invention relates to a lithographic apparatus and a method for manufacturing a device.

3. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

4. SUMMARY

Accordingly, it would be advantageous, for example, to provide an arrangement to remove liquid from the vicinity of the substrate effectively.

According to an aspect of the invention, there is provided a lithographic projection apparatus, comprising:

projection system arranged to project a patterned beam of radiation onto a substrate; and liquid supply system arranged to supply liquid to a space between the projection system and the substrate, the liquid supply system comprising a liquid confinement structure configured to form a seal between its lower surface and the substrate to substantially contain the liquid in the space, wherein a recess in the lower surface is open to a first pressure source for extraction of liquid and/or gas and the recess is also open to a second pressure source, the first pressure source being at a lower pressure than the second pressure source such that there is a flow of gas toward the first pressure source from the second pressure source.

According to an aspect of the invention, there is provided a device manufacturing method, comprising:

containing a liquid in a space between a projection system and a substrate by removing liquid and/or gas from between a liquid confinement structure and a surface of the substrate through a recess in a lower surface of the liquid confinement structure, the recess being open to first and second pressure sources, the first pressure source being at a lower pressure than the second pressure source; and projecting a patterned beam of radiation through the liquid onto the substrate.

According to an aspect of the invention, there is provided a lithographic projection apparatus, comprising:

a projection system arranged to project a patterned beam of radiation onto a substrate; and a liquid supply system arranged to supply liquid to a space between the projection system and the substrate, the liquid supply system comprising a liquid confinement structure configured to at least partly confine the liquid in the space and having a first port on a lower surface of the liquid confinement structure open to a first pressure source and a second port on the lower surface open to a second pressure source, the first pressure source being at a lower pressure than the second pressure source such that there is a flow of gas toward the first pressure source from the second pressure source; and a liquid removal device positioned radially inwardly of the first and second ports.

5. BRIEF DESCRIPTION OF THE DRAWINGS

Embodiments of the invention will now be described, by way of example only, with reference to the accompanying schematic drawings in which corresponding reference symbols indicate corresponding parts, and in which.

6. DETAILED DESCRIPTION

Figure 1:
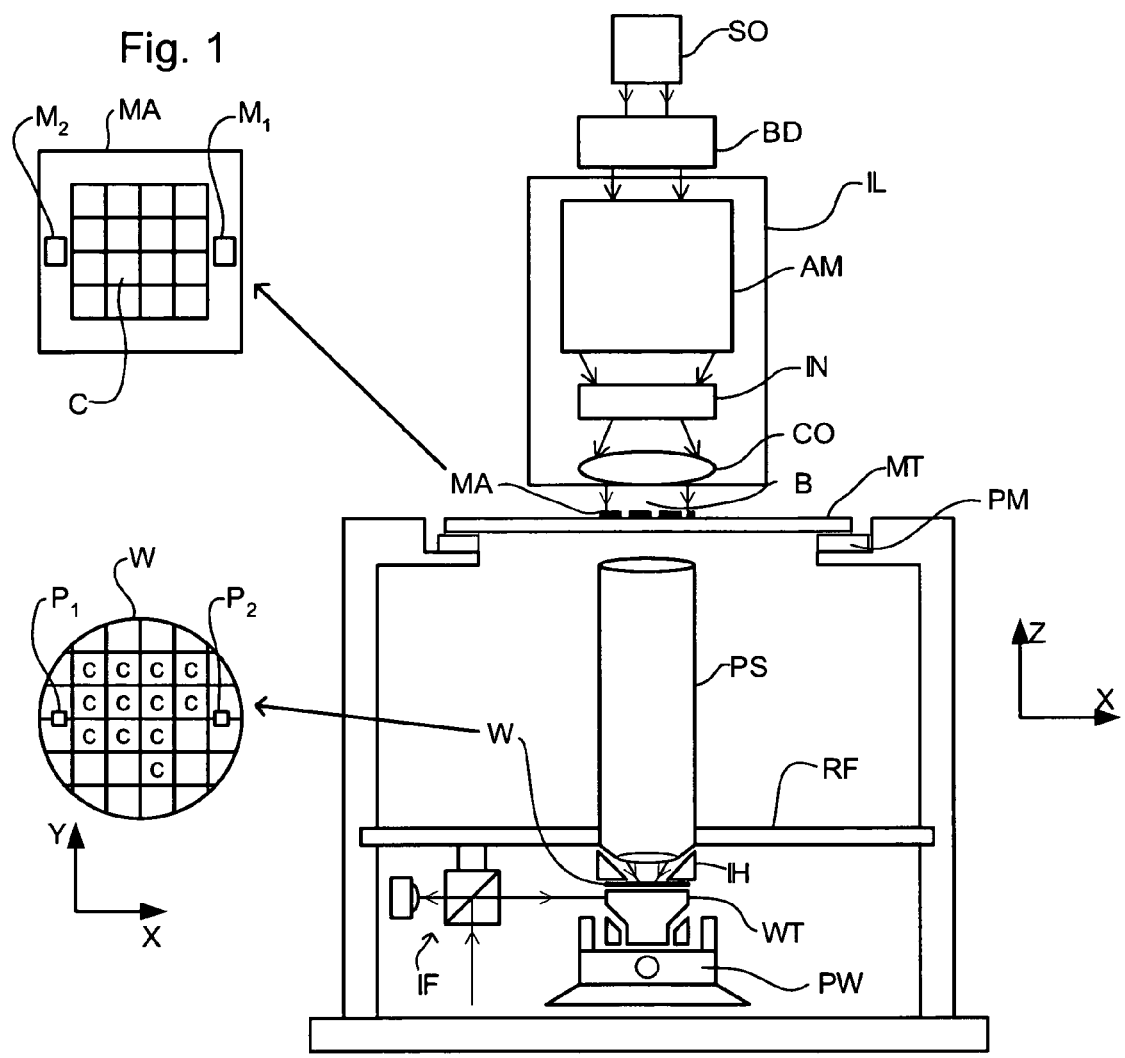
FIG. 1 depicts a lithographic apparatus according to an embodiment of the invention.
Figure 2:
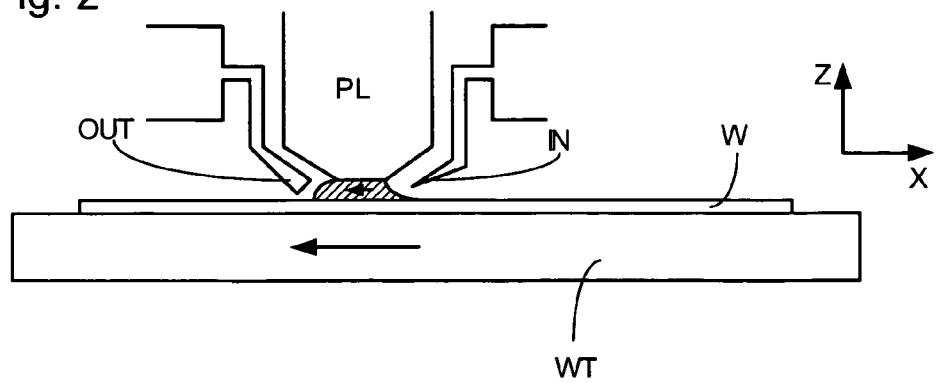
FIGS. 2 and 3 depict a liquid supply system for use in a lithographic projection apparatus.
Figure 3:
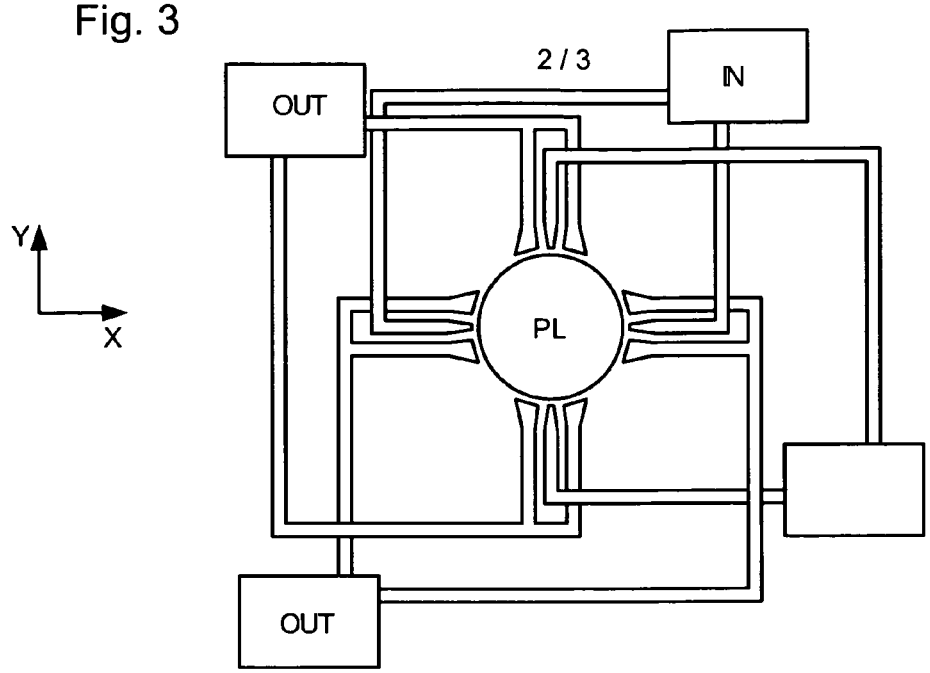

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. A liquid supply system IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
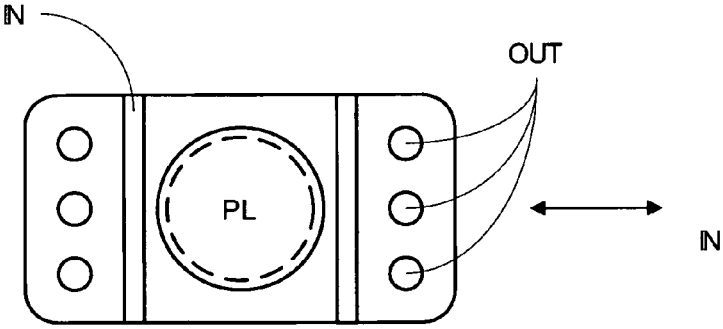
FIG. 4 depicts another liquid supply system for use in a lithographic projection apparatus.
Figure 4:
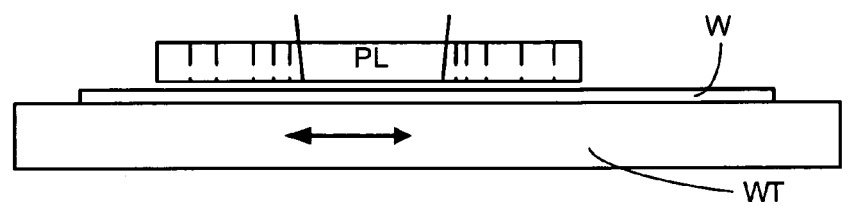

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
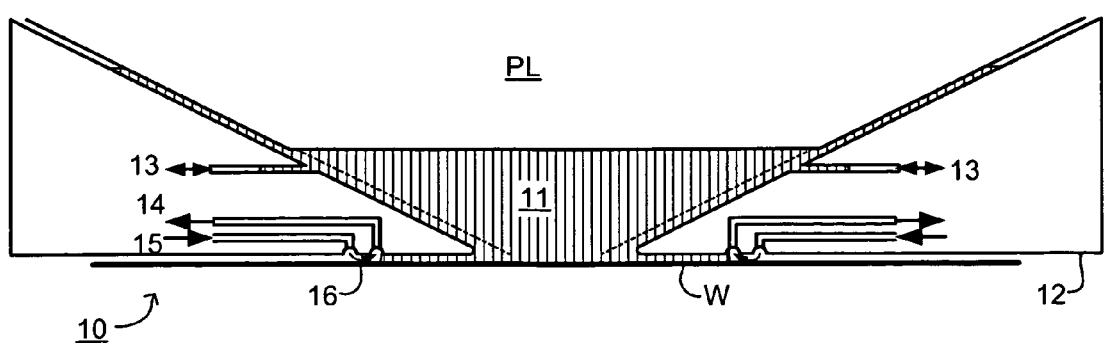
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. An example of such a solution is illustrated in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

FIG. 5 depicts an arrangement of a reservoir 10, which forms a contactless seal to the substrate around the image field of the projection system so that liquid is confined to fill a space between the substrate's primary surface, which faces the projection system PL, and the final element of the projection system PL. A liquid confinement structure 12 positioned below and surrounding the final element of the projection system PL forms the reservoir. Thus, the liquid supply system provides liquid on only a localized area of the substrate. The liquid confinement structure 12 forms part of the liquid supply system configured to fill a space between the final element of the projection system and the substrate W (or substrate table WT) with a liquid. Liquid is brought into the space below the projection system via, e.g., inlet 13 and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case. The patterned beam passes through this aperture.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and the substrate W and extracted via outlet 14. The overpressure on the gas inlet 15, vacuum level on the outlet 14 and geometry of the gap are arranged so that there is a high-velocity gas flow inwards that confines the liquid. It will be understood by the person skilled in the art that other types of seal could be used to contain the liquid such as simply an outlet to remove liquid and/or gas.

Figure 6:
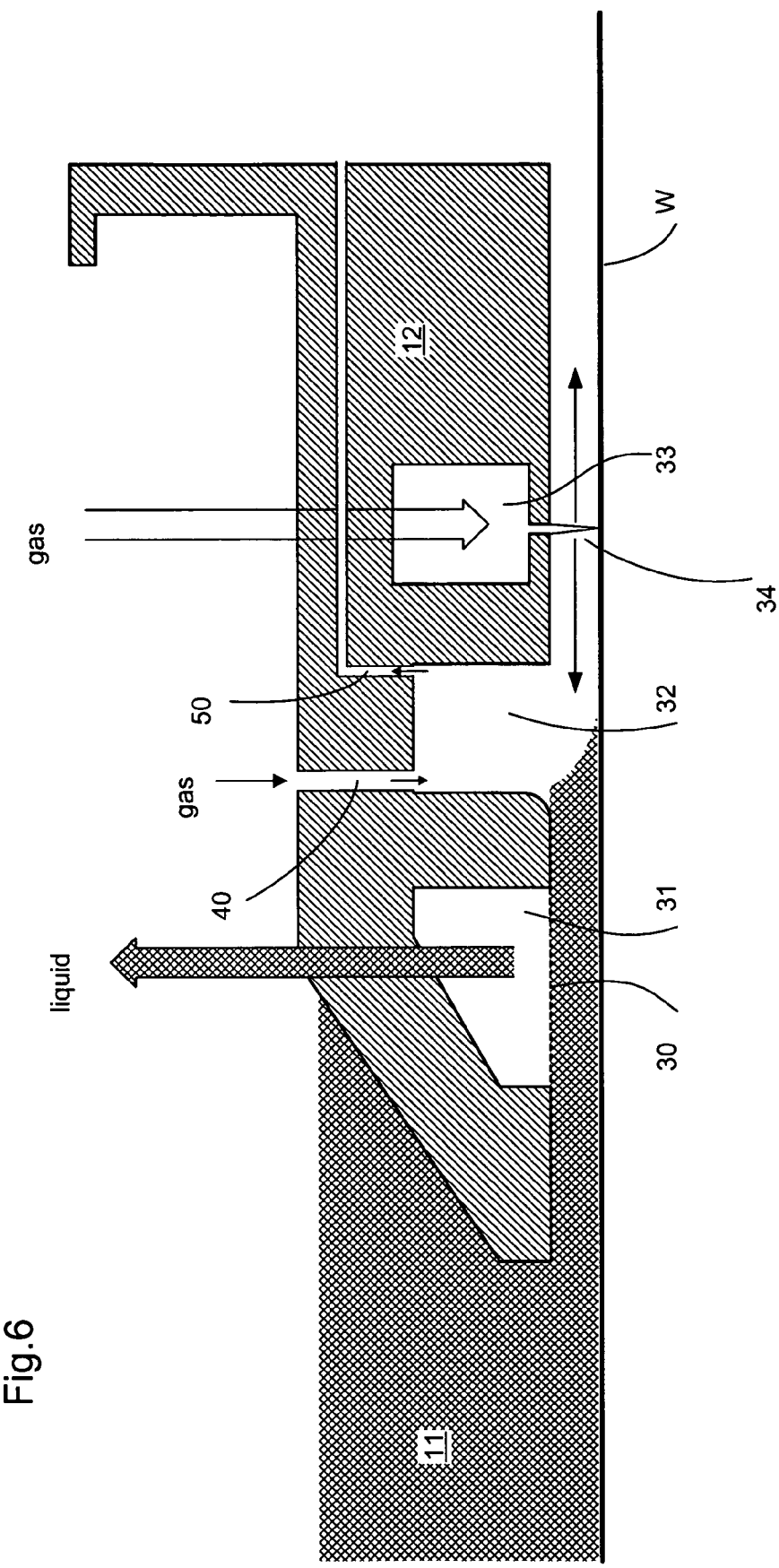
FIG. 6 depicts a liquid supply and removal system according to an embodiment of the invention.

FIG. 6 shows a liquid removal device 30, 31, such as disclosed in U.S. patent application Ser. No. 10/921,348, hereby incorporated in its entirety by reference, in a liquid confinement structure 12 of a liquid supply system according to an embodiment of the invention. The liquid removal device comprises a chamber 31 which is maintained at a slight underpressure $p_c$ and is filled with the immersion liquid. The lower surface of the chamber is formed of a thin plate 30 having a large number of small holes, e.g. of diameter $d_{hole}$ in the range of 5 to 50 μm, and is maintained at a height $h_{gap}$ in the range of 50 μm to 300 μm above a surface from which liquid is to be removed, e.g. the surface of a substrate W. In an embodiment, perforated plate 30 is slightly liquidphilic, i.e. having a contact angle of less than 90° to the immersion liquid, e.g. water. The liquid removal device 31 is designed substantially for single phase (liquid) extraction. FIG. 6 is a cross-sectional view of one side of the liquid confinement structure 12, which forms a periphery around the exposure field of the projection system PL (not shown in FIG. 6). In an embodiment, the liquid removal device comprises a chamber 31 near the innermost edge of the underside of the liquid confinement structure 12 that forms a ring around the exposure field, the lower surface of the chamber 31 having a porous plate 30 as described in U.S. patent application Ser. No. 10/921,348. Chamber 31 is connected to one or more suitable pumps or other low pressure sources to remove liquid from the chamber and maintain the desired underpressure. In use, the chamber 31 is full of liquid but is shown empty for clarity.

Outward of the ring chamber 31 are a gas extraction recess 32 and a gas supply 33. The gas extraction recess 32 and/or the gas supply 33 may be formed as a ring around the exposure field. The gas supply 33 comprises a chamber with a narrow slit in its lower part and is supplied with gas, e.g. air, artificial air or $N_2$, at a pressure such that the gas escaping out of the slit forms a gas knife 34. The gas forming the gas knife is extracted by one or more suitable low pressure pumps or other sources connected to the gas extraction recess 32, described below, so that the resulting gas flow drives residual liquid inwardly where it can be removed by the liquid removal device 31 and/or the gas extraction recess 32, the low pressure pump(s) or other source(s) therefore should be able to tolerate vapor of the immersion liquid and/or small liquid droplets.

In the apparatus shown in FIG. 6, most of the gas that forms the gas knife is extracted via the gas extraction recess 32, but some gas may flow into the environment around the liquid confinement structure 12 and potentially disturb the interferometric position measuring system IF. This may be prevented or reduced by the provision of an additional gas extraction recess (not shown for clarity) radially outward from the gas knife 34. This also helps to remove liquid drops on the substrate W or substrate table WT outside (i.e., not under) of the liquid confinement structure 12. The gas knife also functions as an emergency buffer in case the liquid confinement structure 12 approaches the substrate W too closely.

Because in this embodiment, the liquid removal system can remove most of the immersion liquid while at a height of 10 μm to 1 mm, or 50 to 300 μm above the surface of the substrate W or the substrate table WT, less onerous requirements are put on the liquid confinement structure's vertical position than when a gas bearing is used to confine the immersion liquid. This means that the liquid confinement structure may be positioned vertically with a simpler actuation and control system. It also means that the requirements on the flatness of the substrate table and substrate may be reduced, making it easier to provide devices such as sensors in the upper surface of the substrate table WT.

The liquid confinement structure 12 can either be constructed to be fixed relative to the projection system PL or can be arranged to be moveable in the direction of the optical axis and/or rotatable about one or more directions perpendicular to the optical axis. One way of arranging for this is for the liquid confinement structure 12 to bear on the substrate W such that its weight is carried by the substrate W. This can be arranged, for example, by arranging for the gas flow 34 of the gas knife to create a force equal and opposite in direction to the force of gravity on the liquid confinement structure 12. However, because the area of the recess 32 in the lower surface of the barrier member 12 is larger than the area of the slit through which gas from the gas knife 34 exits the liquid confinement structure 12, any variations in pressure of gas in the recess 32 may have a large effect on the force created by that gas on the liquid confinement structure 12 towards the substrate W. It is therefore desirable to try to reduce or minimize pressure fluctuations of gas in the recess 32. This is arranged as described below to prevent the liquid confinement structure 12 from having a negative stiffness, which could otherwise clamp the liquid confinement structure 12 to the substrate W.

As the liquid confinement structure 12 approaches the substrate W, the force exerted by the negative pressure in the extraction recess 32 could increase faster than the force exerted by the positive pressure in the gas knife 32 (because the area is bigger) so that the liquid confinement structure 12 would be driven down towards the substrate W. This can be mitigated by providing, as well as an extraction port 50 which is connected to a relatively low pressure source, an ambient port 40 which is open to a relatively high pressure source such as the ambient atmosphere. In this way, gas enters through the port 40 to take the place of gas and/or liquid which exits through extraction port 50. Thus, it is arranged that there is always a flow of gas through the ambient port 40 so that pressure fluctuations, which change with the distance between the liquid confinement structure 12 and substrate W, are reduced.

The liquid removal device 31 and the relative pressures of gas in chamber 33 and recess 32 (which is controlled by the relative pressures of gases at the ambient and extraction ports) are adjusted to prevent the liquid 11 meniscus being dragged radially inwardly towards the exposure field (on the left hand side of FIG. 6) by movement of the substrate W. Indeed, in an embodiment, the liquid removal device 31 removes only liquid and no gas such that the meniscus of the liquid 11 is positioned under the recess 32. To arrange for this flow, one or more restrictions (or other means) may be used to adjust the relative pressures of the relatively low pressure gas source to which the extraction port 50 is connected and the pressure of the relatively high pressure source to which the ambient port 40 is connected. In an embodiment, a level of −20 to −10 mbar gauge in the recess 32 may be maintained, though a range of from −50 to +100 mbar gauge is a possible working range. If the relatively low pressure source is at a pressure in the range from −50 to −500 mbar gauge or −50 to −200 mbar gauge, the ambient port 40 may be open to the atmosphere to achieve the desired pressure in the recess 32.

With this arrangement, a flow of gas out of the gas knife 34 is created both radially inwardly towards the recess 32 and radially outwardly towards the radially outer edge of the liquid confinement structure 12. The gas flow traveling radially inwardly from the gas knife 34 toward the recess 32 helps maintain the position of the liquid meniscus substantially under the recess 32 and gas and/or liquid is extracted through extraction port 50. Gas is also drawn into the recess 32 through ambient port 40 thereby to avoid pressure fluctuations in the recess 32 when there is a change in height of the liquid confinement structure 12 above the substrate W or a change in flow conditions of either the gas coming from the gas knife 34 or of liquid coming from the space between the final element of the projection system and the substrate W.

In an embodiment, the ambient port 40 is positioned radially inwardly of the extraction port 50 and these ports are, in an embodiment, positioned in a top surface of the recess 32 opposite the side of the recess 32 which is open to the bottom surface of the liquid confinement structure 12 which faces the substrate W. The ambient port 40 and extraction port 50 may be circular grooves (in the same way that recess 32 may be a circular or other loop shape) or those ports may be a plurality of discrete holes in the top surface of the recess 32.

Some operating conditions for the various components of the liquid confinement structure 12 are given. The pressures mentioned are gauge. Therefore the pressure of the relatively high pressure source to which the ambient port 40 is connected is 0 mbar. The relatively low pressure source to which the extraction port 50 is connected is about −100 mbar. In an embodiment, this extraction arrangement is for gas only because removing a mixture of gas and liquid may lead to undesirable vibrations.

In an embodiment, the gas in chamber 33 is at a pressure of about 800 mbar and is humidified gas to reduce or minimize evaporation and thereby cooling of the substrate W though the gas is not necessarily humidified. A typical gas flow rate of 100 liter/min may be used and the gas knife 34 may be provided through an annular continuous cavity or through a plurality of discrete holes. A gas flow rate of about 50 liter/min through the extraction port 50 may be envisaged and a gap between the bottom of the liquid confinement structure 12 and the substrate W of approximately 100 μm (in an embodiment, in the range of 80 to 130 μm).

As used herein, the term ring may be any appropriate shape including circular or rectangular.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus, comprising:
   a projection system arranged to project a patterned beam of radiation onto a substrate; and
   a liquid supply system arranged to supply liquid to a space between the projection system and the substrate, the liquid supply system comprising a liquid confinement structure configured to form a seal between its lower surface and the substrate to substantially contain the liquid in the space, wherein a recess having an opening in the lower surface has a port open to a first pressure source for extraction of liquid and/or gas and the same recess has a port open to a second pressure source, the first pressure source being at a lower pressure than the second pressure source such that there is a flow of gas toward the first pressure source from the second pressure source, the port open to the first pressure source and the port open to the second pressure source arranged at different radial distances in the lower surface of the liquid confinement structure and arranged at a distance further away from the substrate than the recess opening.

2. The apparatus of claim 1, wherein the liquid confinement structure surrounds the space.

3. The apparatus of claim 1, wherein, in plan, the space is smaller in area than the substrate.

4. The apparatus of claim 1, further comprising a gas jet positioned radially outwardly of the recess.

5. The apparatus of claim 4, wherein the gas jet is configured to create a flow of gas between the liquid confinement structure and the substrate radially inwardly toward the recess.

6. The apparatus of claim 4, wherein the gas jet is configured to produce a flow of gas by allowing gas to exit a chamber in which gas is contained at from 200 to 2000 mbar gauge.

7. The apparatus of claim 1, further comprising a liquid removal device positioned radially inwardly of the recess.

8. The apparatus of claim 7, wherein the liquid removal device is arranged substantially to remove only liquid.

9. The apparatus of claim 1, wherein the port to the first pressure source and the port to the second pressure source are positioned in the recess opposite the opening of the recess in the lower surface.

10. The apparatus of claim 1, wherein the port into the recess of the first pressure source is positioned radially outwardly of the port into the recess of the second pressure source.

11. The apparatus of claim 1, wherein gas in the recess is arranged to be at a pressure in the range of from +100 to −50 mbar gauge.

12. The apparatus of claim 1, wherein gas of the first pressure source is at a pressure of from −50 to −500 mbar gauge.

13. The apparatus of claim 1, wherein the recess forms a closed loop around the space.

14. A device manufacturing method, comprising:

containing a liquid in a space between a projection system and a substrate by removing liquid and/or gas from between a liquid confinement structure and a surface of the substrate through a recess having an opening in a lower surface of the liquid confinement structure, the same recess having a respective port to first and second pressure sources, the first pressure source being at a lower pressure than the second pressure source such that there is a flow of gas toward the first pressure source from the second pressure source, the port to the first pressure source and the port to the second pressure source arranged at different radial distances in the lower surface of the liquid confinement structure and arranged at a distance further away from the substrate than the recess opening; and projecting a patterned beam of radiation through the liquid onto the substrate.

15. The method of claim 14, wherein the liquid confinement structure surrounds the space.

16. The method of claim 14, wherein, in plan, the space is smaller in area than the substrate.

17. The method of claim 14, further comprising supplying jet of gas radially outwardly of the recess.

18. The method of claim 17, wherein the gas jet creates a flow of gas between the liquid confinement structure and the substrate radially inwardly toward the recess.

19. The method of claim 14, further comprising removing liquid radially inwardly of the recess.

20. The method of claim 19, comprising removing substantially only liquid.

21. A lithographic projection apparatus, comprising:

a projection system arranged to project a patterned beam of radiation onto a substrate; and a liquid supply system arranged to supply liquid to a space between the projection system and the substrate, the liquid supply system comprising a liquid confinement structure configured to at least partly confine the liquid in the space and having a first port on a lower surface of the liquid confinement structure open to a first pressure source and a second port on the lower surface open to a second pressure source, the first pressure source being at a lower pressure than the second pressure source such that there is a flow of gas toward the first pressure source from the second pressure source;

a liquid removal device positioned radially inwardly of the first and second ports; and a gas jet positioned radially outwardly of the first and second ports.

22. The apparatus of claim 21, wherein, in plan, the space is smaller in area than the substrate.

23. The apparatus of claim 21, wherein the gas jet is configured to create a flow of gas between the liquid confinement structure and the substrate radially inwardly toward the first and second ports.

* * * * *